US006437610B1

(12) United States Patent
Schrödinger

(10) Patent No.: US 6,437,610 B1
(45) Date of Patent: Aug. 20, 2002

(54) HIGH-SPEED OUTPUT DRIVER

(75) Inventor: Karl Schrödinger, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/784,769

(22) Filed: Feb. 15, 2001

(51) Int. Cl.[7] .............................................. H03B 1/00
(52) U.S. Cl. ........................................ 327/108; 326/30
(58) Field of Search ................................. 327/108, 109, 327/112; 326/30, 32, 34, 83, 87

(56) References Cited

U.S. PATENT DOCUMENTS

| 4,719,369 A | | 1/1988 | Asano et al. | 326/30 |
| 5,134,311 A | * | 7/1992 | Biber et al. | 326/30 |
| 5,581,197 A | | 12/1996 | Motley et al. | 326/30 |
| 5,621,335 A | | 4/1997 | Andresen | 326/30 |
| 5,929,654 A | * | 7/1999 | Park et al. | 326/27 |
| 6,060,907 A | | 5/2000 | Vishwanthaiah et al. | 326/87 |
| 6,133,767 A | * | 10/2000 | Caesar et al. | 326/87 |

FOREIGN PATENT DOCUMENTS

| EP | 0 463 316 A1 | 1/1992 |
| EP | 0 999 643 A1 | 5/2000 |

OTHER PUBLICATIONS

Alper Ilkbahar et al.: "Itanium™ Processor System Bus Design", ESSCIRC 2000, Stockholm, Sep. 19–21, 2000, pp. 128–131.

* cited by examiner

*Primary Examiner*—Timothy P. Callahan
*Assistant Examiner*—Linh Nguyen
(74) *Attorney, Agent, or Firm*—Laurence A. Greenberg; Werner H. Stemer; Ralph E. Lochner

(57) ABSTRACT

The invention relates to a high-speed output driver having at least one CMOS inverter (IN1), acting as an amplifier for high-frequency digital signals, which has an n-channel transistor (T11) and a complimentary p-channel transistor (T21) connected in series with it. According to the invention, switch means are provided, which are connected to sensor elements for detecting parameters of the transistors (T11, T21), and which as a function of the detected parameters control or regulate the output current and the output resistance of the driver to a substantially constant value. In this way, a high-speed output driver with substantially constant outset conditions is made available. (FIG. 3)

18 Claims, 5 Drawing Sheets

HIGH-SPEED OUTPUT DRIVER

BACKGROUND OF THE INVENTION

Field of the Invention

The invention relates to a high-speed output driver as generically defined by the preamble to claim 1. Such high-speed output drivers serve in particular to connect two digital circuits via waveguides, in particular 50-ohm lines or 75-ohm lines. They are embodied in CMOS circuits with preferably low supply voltages (<2.5 volts).

One fundamental element of such high-speed output drivers is a differential driver or a single ended driver shown in FIGS. 1 and 2, respectively. In FIG. 1, a differential driver has two standard CMOS inverters with n-channel MOS transistors T1, T3 and complimentary p-channel MOS transistors T2, T4. The two inverters are operated with via input nodes I, In with a differential input voltage Uin. At the node points Q, Qn of the drain terminals of the two inverters, the output voltage Uout is picked up. At the output Q, Qn, a differential load R3 is present, typically of 2×50 ohms=100 ohms. Such a differential driver makes a push-pull output available.

A single ended driver as in FIG. 2 has a standard CMOS inverter with an n-channel MOS transistor T1 and a p-channel MOS transistor T2, which are connected in series. The CMOS inverter acts on a load R3, typically of 50 ohms, at which a rex Vref is present. The rex Vref corresponds for instance to half the supply voltage (single ended output).

The circuits shown in FIGS. 1 and 2 are basic circuits, which for a specific application are given the requisite properties by way of their dimensioning. In particular, the drain-to-source resistances of the transistors are adjusted to suit the desired application.

One disadvantage of the known CMOS inverters or drivers, however, is that the transistor properties are subject to major fluctuations. These fluctuations are due in particular to temperature fluctuations and to parameter fluctuations in the manufacturing process. The properties of the transistors of the CMOS inverters are thus subject to major fluctuation in the temperature and over the course of the production process. These fluctuations, in the applications described, can range up to 100%.

On the other hand, for the high-speed output driver discussed, the requirement is
1. that it have a constant output level, that is, a relatively constant output current, at an external load such as a 50-ohm line with a terminal resistance, and
2. that the driver have a relatively constant output resistance, to prevent reflections from the source. Then, as much as possible, the driver should have an active load in the form of a switching transistor, since passive loads either increase the current consumption or cannot be used at low voltage.

The above two requirements cannot be achieved with conventional CMOS inverters, because of the aforementioned fluctuations in the transistor properties over the temperature and production process. There is accordingly a need to refine the known CMOS inverters or driver circuits with such inverters in such a way that constant outset conditions, that is, a substantially constant output current and a substantially constant output resistance of the driver, prevail.

In the publication entitled "Itanium™ Processor System Bus Design" by A. Ilkbahar, S. Venkataraman, H. Muljono, ESSCIRC 2000, Stockholm, Sep. 19–21, 2000, pages 128–131, an output driver circuit for the Intel Itanium™ processor is described, in which an inverter for setting a desired output impedance is discretely connected to parallel inverters. However, this is done with a view to adapting the driver to variable capacitive output loads.

SUMMARY OF THE INVENTION

The object of the present invention is to make a high-speed output driver with a CMOS inverter acting as an amplifier for digital signals available which is distinguished by a substantially constant output current and a substantially constant output resistance.

Hence according to the invention, switch means are provided which are connected to sensor elements for detecting parameters of the transistors of the CMOS inverter, and which as a function of the detected parameters control or regulate the output current and the output resistance of the driver to an essentially constant value. The input parameters of the transistors, which are delivered as input signals to the switch means, are in particular the temperature and parameters pertaining to the production process. These parameters are detected via a temperature sensor and process sensor, respectively.

Accordingly, the invention furnishes a controller or regulator which as its input signals receives transistor parameters that are subject to fluctuations, and which on the basis of these input signals controls or regulates the output current and the output resistance of the driver to a substantially constant value.

For control (without feedback) or regulation (with feedback), additional transistors are added either digitally (discretely) or in analog fashion, which change the output properties of the driver and in particular its drain-to-source resistance.

In a preferred feature of the invention, it is accordingly provided that connected to the output of the CMOS inverter is the output of at least one further, additional CMOS inverter. This at least one further CMOS inverter is discretely connected to or disconnected from corresponding switches via digital control signals. Via the addition or subtraction of additional individual transistors or inverters, the output properties of the driver can be varied as desired. Thus an added inverter for the output makes an increased current (higher output level) available and a reduced output impedance.

The addition of further inverter stages can be done alternatively by controlling the gate terminal or the source terminal.

Preferably, the size of the transistors is weighted and in particular amounts to 1, 2, 4, ..., $2^n$ times a basic size, so that a fine adjustment of the output properties of the driver can be made.

A control unit which receives analog input signals of a temperature sensor and a process sensor and on the basis of these signals outputs digital control signals to switches for discrete addition or subtraction of the further transistors or CMOS inverters is preferably used as the control means.

In an alternative variant embodiment of the invention, adding of individual transistors for varying the output properties of the driver is done not via a digital controller but via an analog controller. It is provided that the switch means control additional transistors in analog fashion, and at least one additional transistor is connected in series with the n-channel and p-channel MOS transistors of the inverter, so that via the additional transistors, the impedance of the amplifier branches of the inverter can be adjusted.

The added transistors are preferably each operated in the triode range, in which a transistor represents a linear resistance. The resistance additionally made available by the transistor is substantially linearly dependent, in this range, on the voltage applied to the gate terminal.

In a further feature of the invention, not only is the output level controlled but also regulated; that is, work is additionally done with feedback. Regulation is preferably done by the provision of a regulating circuit in the form of a mirror circuit, which regulates the operating point of each added transistor. The elements of the mirror circuit correspond in their size to the elements of the driver circuit, or are scaled by a certain value compared to the driver circuit. By scaling by the factor n, the current consumption can be reduced by the factor 1/n.

The mirror circuit preferably includes an operational amplifier, which regulates the control voltage for the mirror circuit to a value such that the desired output level is established at the output of the mirror circuit and thus also at the output of the driver.

The invention will be described in further detail below in conjunction with the drawing figures and in terms of several exemplary embodiments. Shown are:

DESCRIPTION OF THE PREFERRED EMBODIMENT

Figure 1:
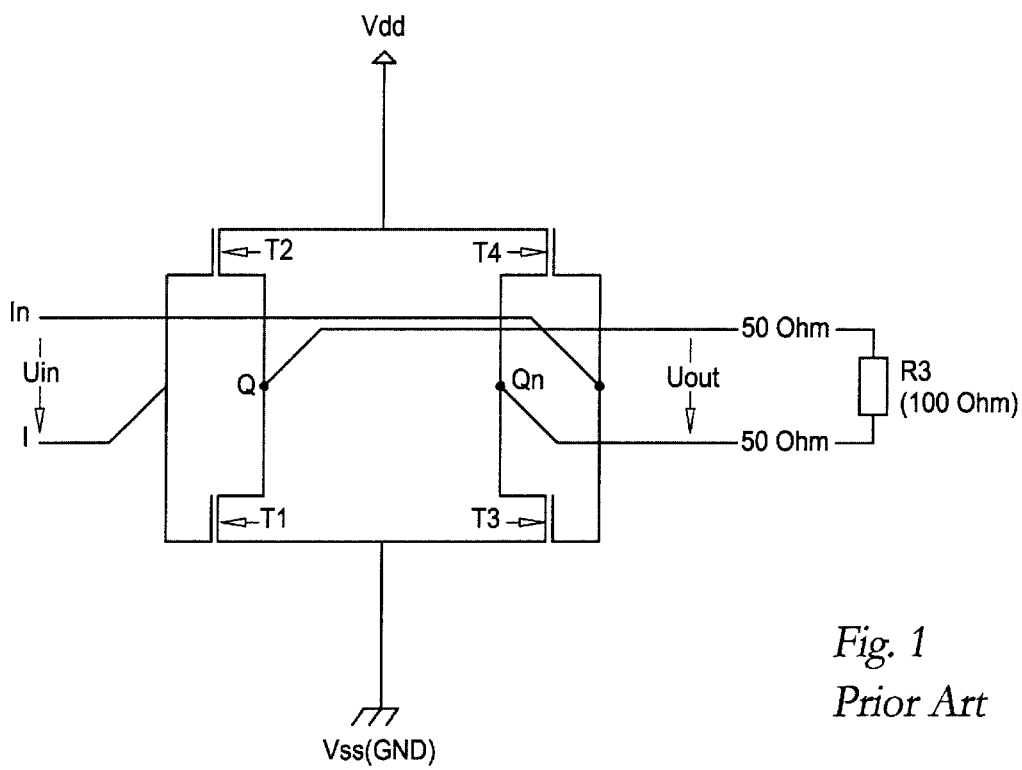
FIG. 1—a differential output driver in accordance with the prior art.
Figure 2:
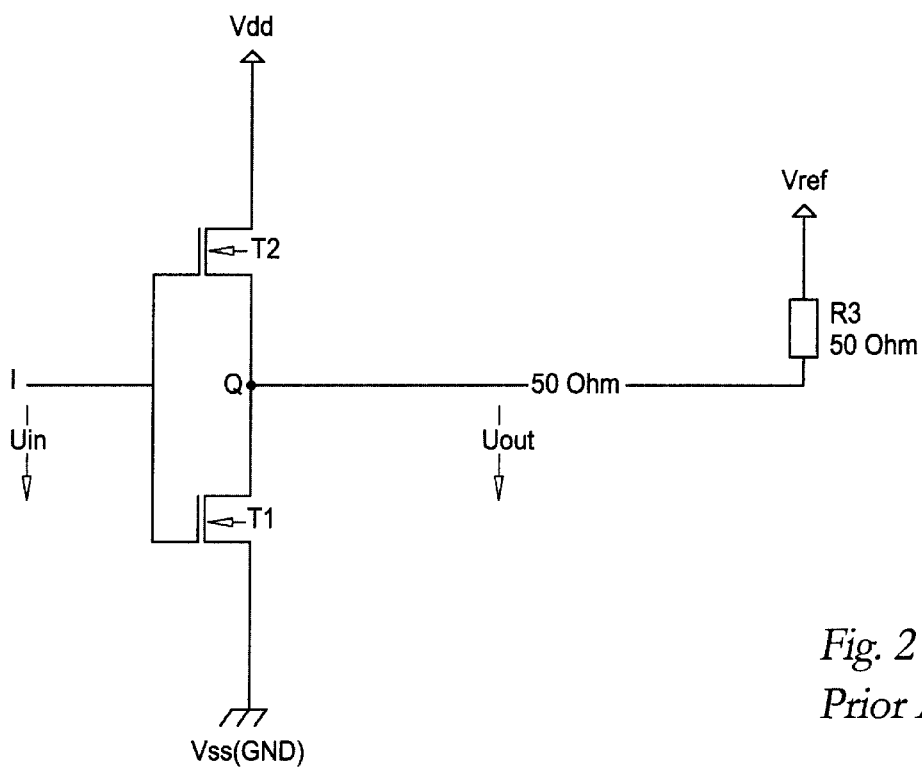
FIG. 2—a single ended output driver in accordance with the prior art.

The fundamental basic circuits of a high-speed output driver according to the invention have already been explained at the outset in conjunction with FIGS. 1 and 2. It will be noted that the exemplary embodiments that follow, shown in FIGS. 3–8, pertain to circuit variants in which a single ended circuit as in FIG. 2 is used. However, the ensuing exemplary embodiments are equally usable in a corresponding way for differential circuits as in FIG. 1, since those are fundamentally constructed symmetrically.

Figure 3:
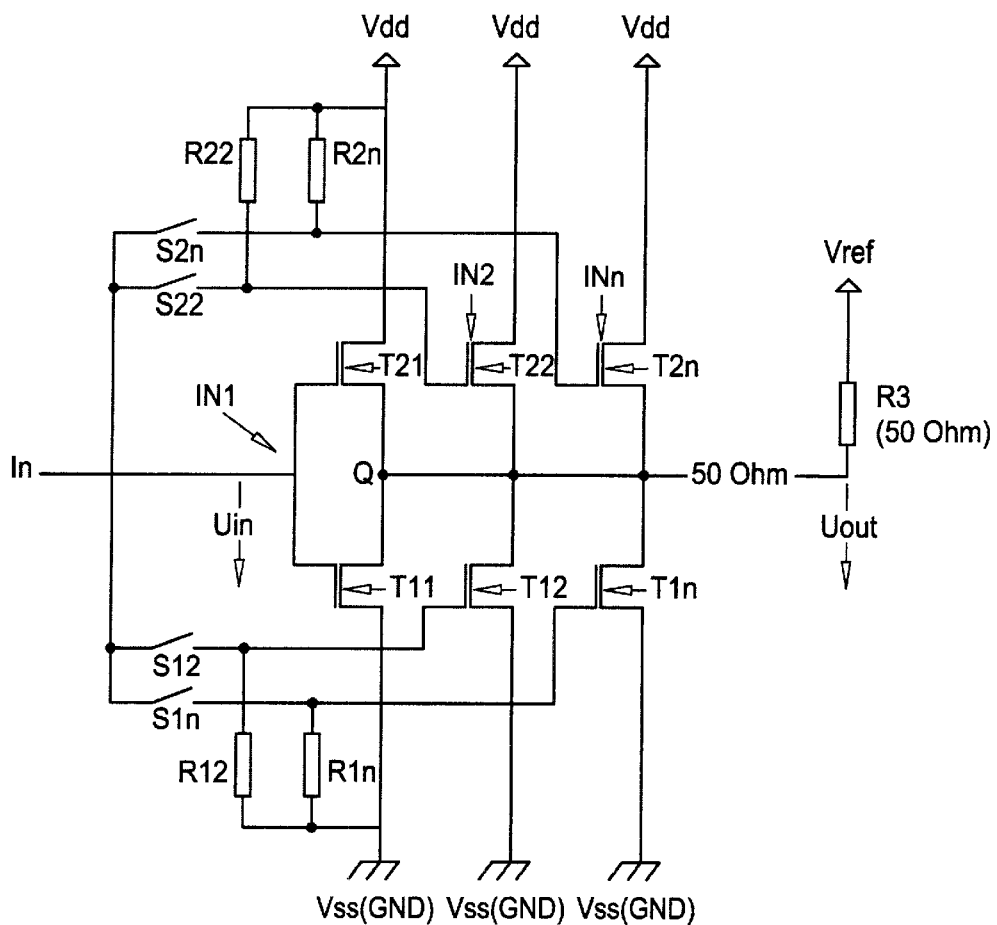
FIG. 3—a first exemplary embodiment of a digitally switched driver according to the invention with control of the gate terminals.

In FIG. 3, a first inverter IN1 is provided, which comprises a p- channel MOS transistor T21 and an n-channel MOS transistor T11, which are embodied as complimentary and are connected in series. A digital input voltage Uin is applied to an input node I, and a likewise digital output signal is picked up at an output node Q. The transistor T11 is connected by its source terminal to the ground potential Vss (GROUND), and the transistor T21 is connected by its source terminal to the operating voltage Vdd.

If the input voltage LOW is applied to the input node I, the transistor T11 blocks, and the output Q is pulled to the operating voltage Vdd. Conversely, if the input voltage at the input node I assumes the value HIGH, the upper transistor T21 blocks, and the output Q is pulled to ground. Such CMOS inverters are known per se.

According to the invention, downstream of the output Q of the first inverter IN1, further inverters IN2 through INn are now connected, which have transistors T12, T22 and T1n, T2n, respectively and are disposed parallel to the inverter IN1. In principle, any arbitrary number of additional inverters can be added, but in FIG. 3 only two additional inverters IN2, INn are shown.

The gate terminals of the transistors of the further inverters IN2, INn, like the gate terminals of the transistors of the inverter IN1, are all located at the reference point I and thus at the input voltage Uin. However, the connection is made via switches S12, S1n, S22, S2n, by way of whose control the addition of the further inverters IN2 through INn is controllable.

The gate terminals of the transistors of the further inverters IN2, INn are connected to the operating voltage Vdd or GROUND via resistors R22, R2n and R12, R1n. The resistors serve, when the switches S12, S1n, S22, S2n are open, to pull the gate terminal to GROUND or Vdd, so that the various inverters IN2 through INn are blocked. In that case, the transistors T12, T22, T1n, T2n have high impedance.

The fine adjusting of the total impedance is done via the choice of the size of the transistors of the additional inverters IN2, INn. These are preferably weighted and amount approximately to 1, 2, 3, 4, . . . , $2^n$ times the size of the transistors T11, T12 of the inverter IN1.

A 50-ohm line with a terminal resistance R3, preferably also 50 ohms, is applied to the output Q of the driver circuit. The (50-ohm) resistor R3 is connected to a rex Vref.

The output voltage Uout dropping at the output resistance R3 is dependent on the number of parallel-disposed inverters IN1, IN2, . . . , INn. Via a suitable addition or subtraction of the parallel-disposed inverters IN2, INn via the switches S12, S1n, S22, S2n, a constant output current and a constant output resistance of the driver circuit can be furnished. When an inverter IN2, INn is added, the output current is increased and the output resistance is reduced, since the further inverter makes an additional current path, applied to the output node Q, available. If accordingly because of altered transistor properties the output resistance increases, this can be compensated for by adding a further inverter. By subtracting an inverter, a decreasing output resistance can also be compensated for.

The circuit shown is distinguished furthermore in that it makes do with extremely low supply voltages, where Vdd=1 . . . 1.8 V. As a result, very high-speed circuits with a clock frequency of up to several gigahertz, as are needed for modern technologies, can be achieved.

The high-speed output driver shown is preferably used for connecting two circuit arrangements on a printed circuit board by means of a 50-ohm line. It furnishes an interface with further circuits.

Figure 6:
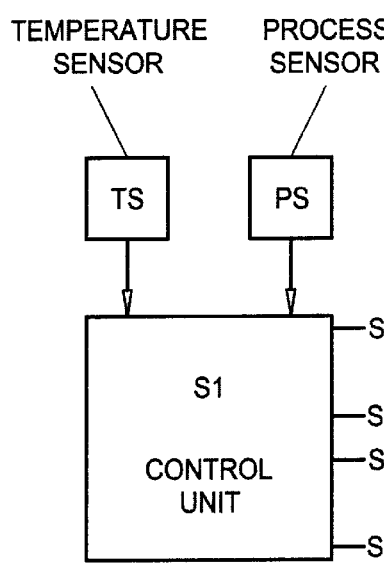
FIG. 6—a digital control unit for an output driver according to the invention.

A control of the switches shown in FIG. 3 is effected via a digital control unit as in FIG. 6. The control unit S1 is connected to a temperature sensor TS and to a process sensor PS, which output analog input signals to the control unit S1. The temperature sensor TS furnishes an input signal to the control unit S1 that is a measure for the temperature of the transistors T11, T21 of the inverter IN1. For example, the temperature sensor is disposed in the immediate vicinity of the CMOS inverter on a common substrate.

The process sensor PS furnishes an input signal which is a measure for process parameters of the transistors. The process sensor PS for instance measures the output impedance or output current of a comparable transistor and outputs a signal accordingly to the control unit S1. The control unit in turn thereupon generates suitable control signals for the switches S12, S1n, S22, S2n. The process sensor can also form a unit together with the temperature sensor.

On the basis of these input signals, the control unit S1 generates control signals for the switches S11, S1n, S21, S2n, with which the switches are actuated and the various inverters IN2 through INn are added or subtracted.

Figure 4:
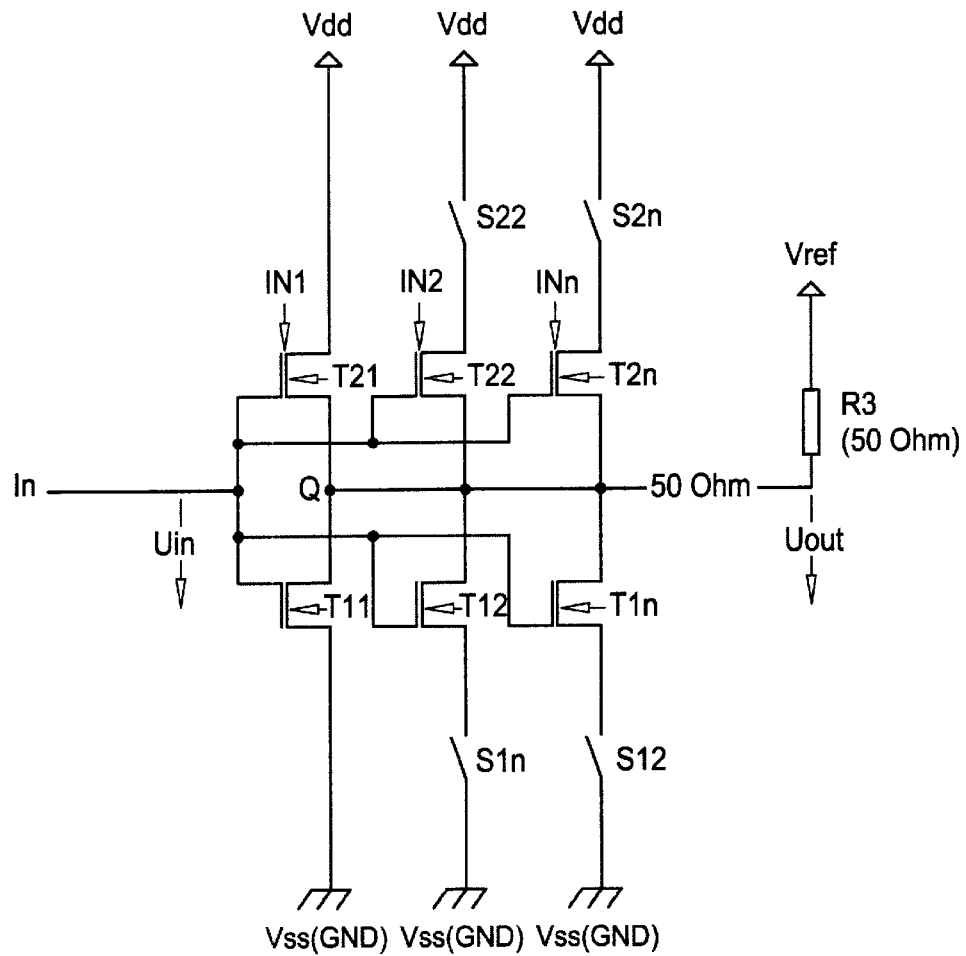
FIG. 4—a second exemplary embodiment of a digitally switched driver according to the invention with control of the source terminals.

The high-speed output driver of FIG. 4 is essentially equivalent to the driver of FIG. 3, so that the discussion thereof should be referred to. The difference is that the switches S12, S1N and S22, S2n control not the gate terminals but the source terminals of the transistors T12, T22, T1n, T2n. In that case the resistors R12, R1n, R22, R2n of FIG. 3 are omitted. Any possible weighting of the size of the transistors is done directly via the choice of the transistors.

Figure 5:
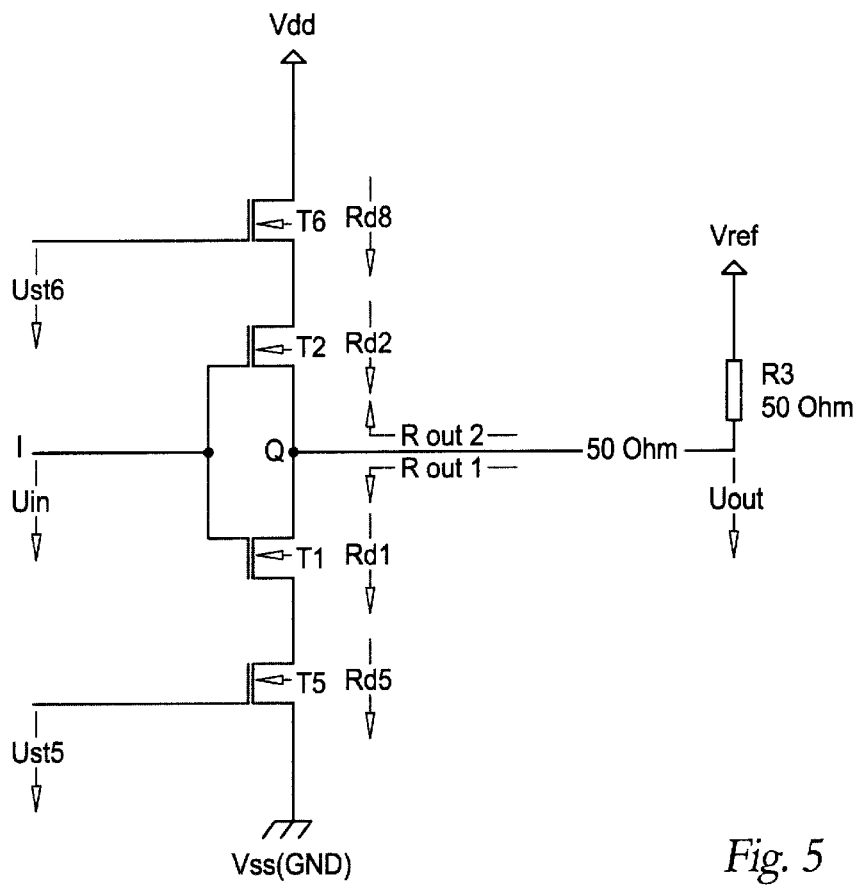
FIG. 5—an exemplary embodiment of a driver according to the invention with analog control.

In FIG. 5, an alternative exemplary embodiment of the invention is shown, in which analog control of the inverter IN is performed. The inverter IN itself is embodied as described in conjunction with FIG. 3 and has an n-channel transistor T1 and a p-channel transistor T2. However, now, a further p-channel transistor T6 is connected in series between the source terminal of the transistor T2 and the operating voltage Vdd, and its gate terminal is acted upon by a control voltage Ust6. Correspondingly, between the source terminal of the transistor T1 and the potential Vss (GROUND), a further n-channel transistor T5 is connected, whose gate terminal is acted upon by a control voltage Ust5.

Depending on the input voltage Uin applied to the input node I, either the transistors T2 and T6, or the transistors T1 and T5 are conductive; the various resistances Rd2, Rd6 and Rd1, Rd5, occurring at the various transistors, add up to output resistances Rout2 of the upper arm and Rout1 of the lower arm.

If a HIGH level is applied to the node I, the transistor T2 blocks, and the current and the output resistance are determined by the sum of the source-to-drain resistors Rd1, Rd5 of T1 and T5 (Rout1=Rd1+Rd5). In that case, a LOW level is present at the output Q.

The additional transistor T5 is now selected to be large and with fully advanced control, so that the total resistance Rout1 of this branch is essentially determined by Rd5. By means of the control voltage Ust5, the resistance or current flow of the inverter can then be controlled.

On the assumption that the applied voltages are low, which is the case at the supply voltages indicated of Vdd between 1 V and 1.8 V, the transistor T5 is operated in the triode range; that is, it represents a linear resistance. Thus simple control of the output impedance of the driver is possible.

For the case where a LOW level is applied to the node I, the conditions are correspondingly transposed.

Figure 7:
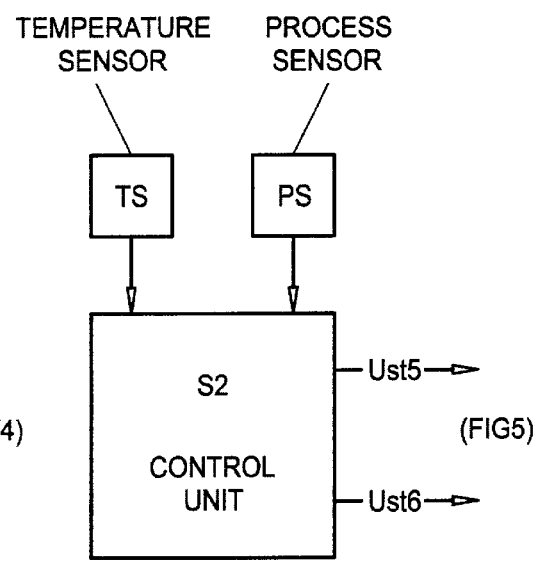
FIG. 7—an analog control unit for an output driver according to the invention.

For controlling the voltages Ust5 and Ust6, a control unit S2 of FIG. 7 is provided. The control unit S2 is in turn connected with the output signals of a temperature sensor TS and a process sensor PS. Unlike the control unit of FIG. 6, however, analog output signals Ust5 and Ust6 are generated.

Figure 8:
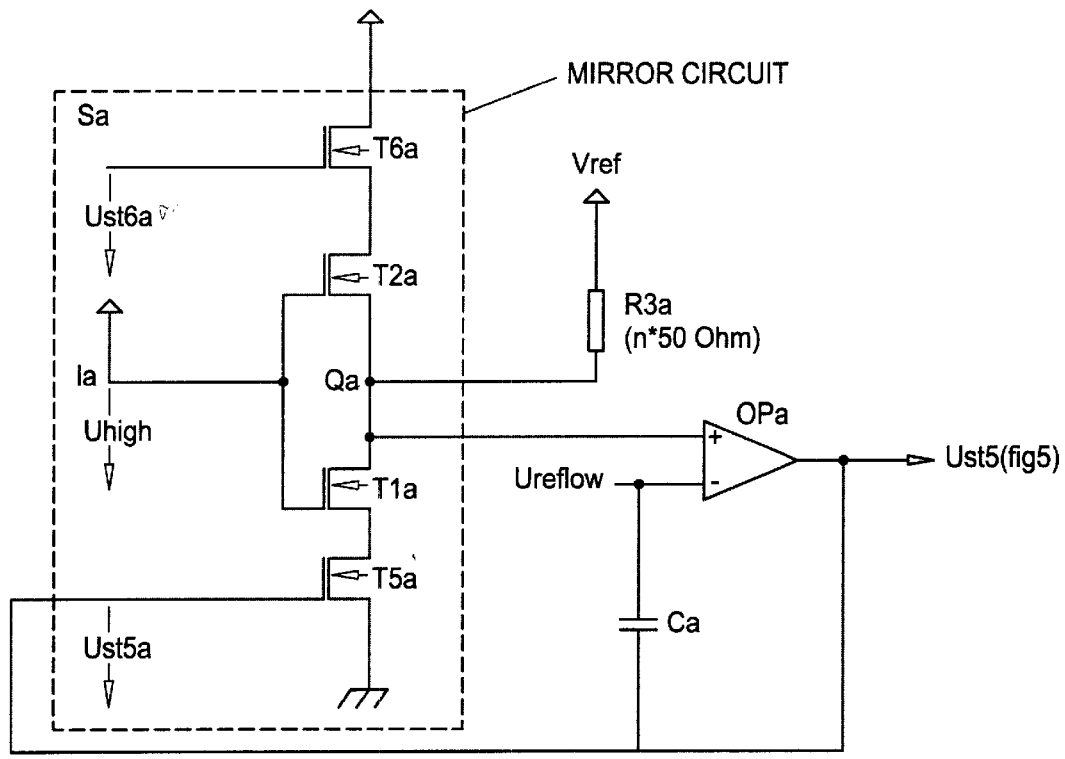
FIG. 8—two mirror circuits for regulating the control voltages of the driver of FIG. 5.
Figure 8:
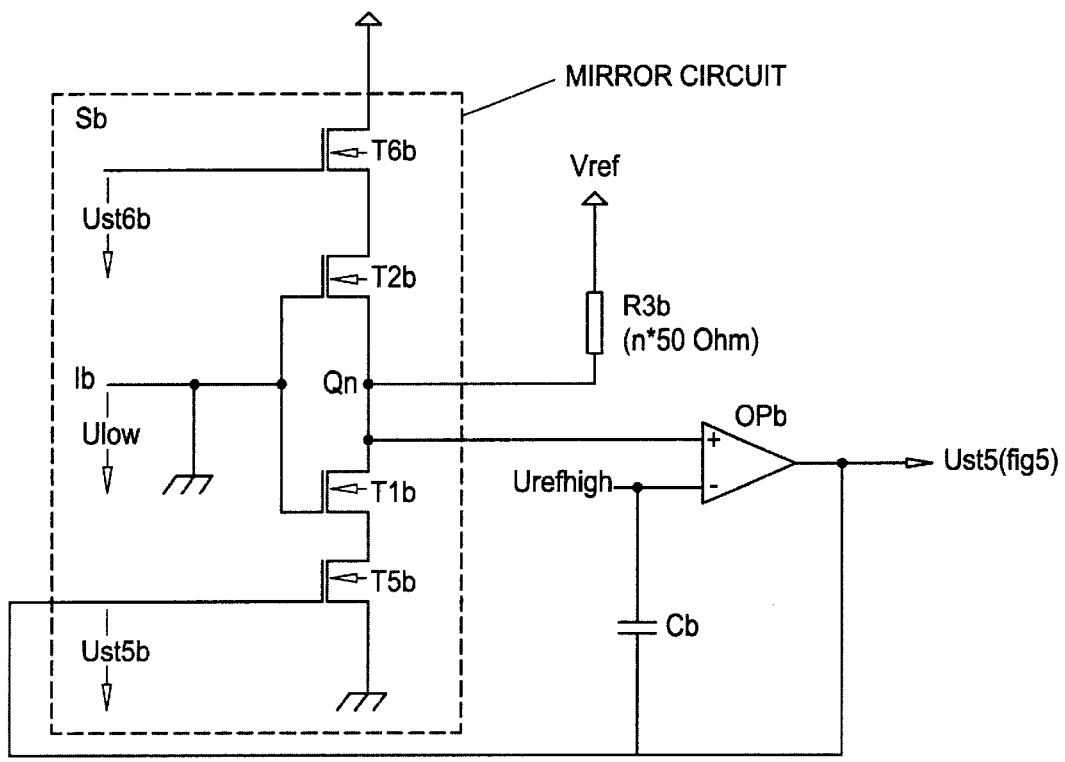

In FIG. 8, a further refinement of the invention is shown, in which not only control but also regulation of the output parameters of the inverter IN is done. To generate the control voltages Ust5 and Ust6 for the circuit of FIG. 5, two mirror circuits Sa and Sd are provided. The mirror circuits Sa and Sd are constructed such that their elements correspond to the elements of the actual driver circuit of FIG. 5. Corresponding elements of the mirror circuit are identified by the added letters "a" and "b".

The mirror elements of the mirror circuit Sa, Sb can either have the same size as the corresponding elements of the driver circuit, or scaling of the mirror elements may be provided, in order to reduce the current consumption of the mirror circuit. At a scaling factor n, by which the current consumption of the mirror circuit is reduced but without changing its properties, the transistors T2a, T6a, T1a and T5a of the mirror circuit Sa are lower by the factor 1/n, and the resistor R3a is greater by the factor n, than the corresponding parts of the output driver of FIG. 5. The same is correspondingly true for the elements of the mirror circuit Sb.

The node Ia and Ib of the mirror circuits Sa, Sb is set at the applicable logic level (HIGH, LOW). The inverted, amplified signal is present respectively at the outputs Qa and Qb.

The output Qa and Qb is connected to the noninverted input of an operational amplifier OPa and OPb, respectively. The inverted input of the operational amplifier OPa, OPb is connected, via a capacitor Ca and Cb, respectively, to the gate terminal of the transistor T5a and T6b. The output of the operational amplifier is connected directly to the gate terminal of the transistor T5a and T6b. The output of the operational amplifier OPa and OPb also furnishes the control voltage Ust5 and Ust6, respectively, for the driver of FIG. 5.

The respective operational amplifier OPa, OPb regulates the control voltage Ust5a, Ust6b to a value that establishes the desired output level at Qa and Qb, respectively. The specification (set-point value) is made in each case by the voltage Ureflow, Urefhigh, respectively, at the inverted input of the operational amplifier.

Since the applicable control voltage also controls the actual driver of FIG. 5, the result at the output Q of the driver is the same output voltages as in the mirror circuit at Qa, Qb.

The control voltages Ust6a in the circuit part Sa and Ust5b in the circuit part Sb are not relevant, since the respective preceding transistor T2a in Sa and T1b in Sb is blocked. Thus the transistors T6a and T5b can either be blocked or omitted. The invention is not limited in its realization to the exemplary embodiments described above. The sole factor that is essential to the invention is that switch means are provided which control or regulate the output current and the output resistance of a high-speed output driver, as a function of input parameters, to a substantially constant value, and an addition or subtraction of additional transistors, integrated with the driver, is performed.

I claim:

1. A high-speed output driver, comprising:
   a driver stage having an output providing an output current and an output resistance, said driver stage including at least one CMOS inverter acting as an amplifier for high-frequency digital signals, said at least one CMOS inverter including a first inverter having transistors including an n-channel transistor and a complimentary p-channel transistor connected in series with said n-channel transistor, said at least one CMOS inverter defining said output of said driver stage;
   sensor elements for detecting parameters of said transistors; and a switching device connected to said sensor elements;

said switching device controlling or regulating, as a function of said parameters detected by said sensor elements, said output current of said driver stage to a substantially constant value and said output resistance of said driver stage to a substantially constant value.

2. The output driver according to claim 1, wherein said sensor elements include a temperature sensor for detecting temperature parameters of said transistors and a process sensor for detecting process parameters of said transistors.

3. The output driver according to claim 2, wherein:

said first inverter has an output;

said at least one CMOS inverter includes at least one additional CMOS inverter having an output;

and the output driver further comprises:
switches;
said switching device providing digital control signals controlling said switches for discretely connecting said output of said additional CMOS inverter to said output of said first inverter and for discretely disconnecting said output of said additional CMOS inverter from said output of said first inverter.

4. The output driver according to claim 1, wherein:

said first inverter has an output;

said at least one CMOS inverter includes at least one additional CMOS inverter having an output;

and the output driver further comprises:
switches;
said switching device providing digital control signals controlling said switches for discretely connecting said output of said additional CMOS inverter to said output of said first inverter and for discretely disconnecting said output of said additional CMOS inverter from said output of said first inverter.

5. The output driver according to claim 4, wherein said additional CMOS inverter includes transistors having gate terminals that are connected to said switches.

6. The output driver according to claim 4, wherein said additional CMOS inverter includes transistors having source terminals that are connected to said switches.

7. The output driver according to claim 4, wherein said at least one CMOS inverter includes said first inverter and a plurality of additional inverters, said transistors of said first inverter have a basic size, and each one of said plurality of said inverters have transistors with a weighted size that is a multiple of said basic size of said transistors of said first inverter.

8. The output driver according to claim 7, wherein said multiple of said basic size is selected from the group consisting of 1, 2, 3, 4 . . . and $2^n$.

9. The output driver according to claim 1, wherein:

said driver stage includes at least one first additional transistor connected in series with said p-channel transistor, said first additional transistor having a gate; and said driver stage includes at least one second additional transistor connected in series with said n-channel transistor, said second additional transistor having a gate;

said switching device providing analog control voltages to control said gate of said first additional transistor and said gate of said second additional transistor.

10. The output driver according to claim 9, wherein said sensor elements include a temperature sensor for detecting temperature parameters of said p-channel transistor and said n-channel transistor and a process sensor for detecting process parameters of said p-channel transistor and said n-channel transistor.

11. The output driver according to claim 9, wherein said first additional transistor and said second additional transistor are operated in a triode range.

12. The output driver according to claim 11, comprising:

a first regulating circuit forming a mirror circuit; and a second regulating circuit forming a mirror circuit;

said first additional transistor having an operating point regulated by said first regulating circuit;

said second additional transistor having an operating point regulated by said second regulating circuit.

13. The output driver according to claim 9, comprising:

a first regulating circuit forming a first mirror circuit; and a second regulating circuit forming a second mirror circuit;

said first additional transistor having an operating point regulated by said first mirror circuit;

said second additional transistor having an operating point regulated by said second mirror circuit.

14. The output driver according to claim 13, comprising:

a first operational amplifier and a second operational amplifier;

said first mirror circuit providing an output and receiving a control voltage;

said second mirror circuit providing an output and receiving a control voltage;

said first operational amplifier regulating the control voltage of said first mirror circuit such that a desired output level establishes itself at said output of said first mirror circuit and at said output of said driver stage; and said second operational amplifier regulating the control voltage of said second mirror circuit such that a desired output level establishes itself at said output of said second mirror circuit and at said output of said driver stage.

15. The output driver according to claim 13, wherein:

said driver stage includes a plurality of transistors defined by said n-channel transistor, said p-channel transistor, said first additional transistor, and said second additional transistor, each one of said plurality of said transistors of said driver stage having a size;

said first mirror circuit includes a plurality of transistors, each one of said plurality of said transistors of said first mirror circuit corresponds to a respective one of said plurality of said transistors of said driver stage;

each one of said plurality of said transistors of said first mirror circuit has a size that is the same as said size of said corresponding one of said plurality of said transistors of said driver stage;

said second mirror circuit includes a plurality of transistors, each one of said plurality of said transistors of said second mirror circuit corresponds to a respective one of said plurality of said transistors of said driver stage; and each one of said plurality of said transistors of said second mirror circuit has a size that is the same as said size of said corresponding one of said plurality of said transistors of said driver stage.

16. The output driver according to claim 15, comprising:

a first operational amplifier and a second operational amplifier;

said first mirror circuit providing an output and receiving a control voltage;

said second mirror circuit providing an output and receiving a control voltage;

said first operational amplifier regulating the control voltage of said first mirror circuit such that a desired output level establishes itself at said output of said first mirror circuit and at said output of said driver stage; and said second operational amplifier regulating the control voltage of said second mirror circuit such that a desired output level establishes itself at said output of said second mirror circuit and at said output of said driver stage.

17. The output driver according to claim 13, wherein:

said driver stage includes a plurality of transistors defined by said n-channel transistor, said p-channel transistor, said first additional transistor, and said second additional transistor, each one of said plurality of said transistors of said driver stage having a size;

said first mirror circuit includes a plurality of transistors, each one of said plurality of said transistors of said first mirror circuit corresponds to a respective one of said plurality of said transistors of said driver stage;

each one of said plurality of said transistors of said first mirror circuit has a size that is scaled, by a factor, from said size of said corresponding one of said plurality of said transistors of said driver stage;

said second mirror circuit includes a plurality of transistors, each one of said plurality of said transistors of said second mirror circuit corresponds to a respective one of said plurality of said transistors of said driver stage; and each one of said plurality of said transistors of said second mirror circuit has a size that is scaled, by a factor, from said size of said corresponding one of said plurality of said transistors of said driver stage.

18. The output driver according to claim 17, comprising:

a first operational amplifier and a second operational amplifier;

said first mirror circuit providing an output and receiving a control voltage;

said second mirror circuit providing an output and receiving a control voltage;

said first operational amplifier regulating the control voltage of said first mirror circuit such that a desired output level establishes itself at said output of said first mirror circuit and at said output of said driver stage; and said second operational amplifier regulating the control voltage of said second mirror circuit such that a desired output level establishes itself at said output of said second mirror circuit and at said output of said driver stage.

* * * * *